(12) United States Patent
Pearson et al.

(10) Patent No.: US 11,868,252 B2
(45) Date of Patent: Jan. 9, 2024

(54) MEMORY WITH POST-PACKAGING MASTER DIE SELECTION

(71) Applicant: Micron Technology, Inc., Boise, ID (US)

(72) Inventors: Evan C. Pearson, Boise, ID (US); John H. Gentry, Boise, ID (US); Michael J. Scott, Boise, ID (US); Greg S. Gatlin, Mountain Home, ID (US); Lael H. Matthews, Meridian, ID (US); Anthony M. Geidl, Boise, ID (US); Michael Roth, Boise, ID (US); Markus H. Geiger, Boise, ID (US); Dale H. Hiscock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 580 days.

(21) Appl. No.: 16/706,635

(22) Filed: Dec. 6, 2019

(65) Prior Publication Data

US 2021/0173773 A1    Jun. 10, 2021

(51) Int. Cl.
| | |
|---|---|
| *G06F 11/07* | (2006.01) |
| *G06F 12/06* | (2006.01) |
| *H01L 25/065* | (2023.01) |
| *G11C 11/407* | (2006.01) |
| *G11C 29/04* | (2006.01) |

(52) U.S. Cl.
CPC ...... *G06F 12/0646* (2013.01); *G06F 11/0727* (2013.01); *G06F 11/0751* (2013.01); *G06F 11/0793* (2013.01); *G11C 11/407* (2013.01); *G11C 29/04* (2013.01); *H01L 25/0657* (2013.01); *H01L 2225/06541* (2013.01)

(58) Field of Classification Search
CPC ............ G06F 11/0751; G06F 11/0727; G06F 11/1612; G06F 11/3648; G06F 11/3656; G06F 11/16; G06F 11/0793; G11C 29/04; G11C 29/44; G11C 29/70
See application file for complete search history.

(56) References Cited

U.S. PATENT DOCUMENTS 9,153,533 B2 * 10/2015 Haba .................. H01L 23/5256
11,200,961 B1 * 12/2021 Uribe .................... G11C 29/44
(Continued)

*Primary Examiner* — Yolanda L Wilson
(74) *Attorney, Agent, or Firm* — Perkins Coie LLP

(57) ABSTRACT

Memory devices and systems with post-packaging master die selection, and associated methods, are disclosed herein. In one embodiment, a memory device includes a plurality of memory dies. Each memory die of the plurality includes a command/address decoder. The command/address decoders are configured to receive command and address signals from external contacts of the memory device. The command/address decoders are also configured, when enabled, to decode the command and address signals and transmit the decoded command and address signals to every other memory die of the plurality. Each memory die further includes circuitry configured to enable, or disable, or both individual command/address decoders of the plurality of memory dies. In some embodiments, the circuitry can enable a command/address decoder of a memory die of the plurality after the plurality of memory dies are packaged into a memory device.

21 Claims, 4 Drawing Sheets

(56) References Cited

U.S. PATENT DOCUMENTS

| | | | |
|---|---|---|---|
| 2009/0040861 A1* | 2/2009 | Ruckerbauer | G11C 8/12 |
| | | | 365/230.01 |
| 2012/0007624 A1* | 1/2012 | Byeon | G11C 11/4076 |
| | | | 324/750.15 |
| 2012/0216079 A1* | 8/2012 | Fai | G06F 11/362 |
| | | | 714/E11.055 |
| 2013/0336039 A1* | 12/2013 | Frans | G11C 5/063 |
| | | | 365/51 |
| 2018/0122686 A1* | 5/2018 | Or-Bach | H03K 19/17748 |
| 2019/0205244 A1* | 7/2019 | Smith | G06F 3/065 |

* cited by examiner

MEMORY WITH POST-PACKAGING MASTER DIE SELECTION

TECHNICAL FIELD

The present disclosure is related to memory systems, devices, and associated methods. In particular, the present disclosure is related to memory devices with post-packaging master die selection.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
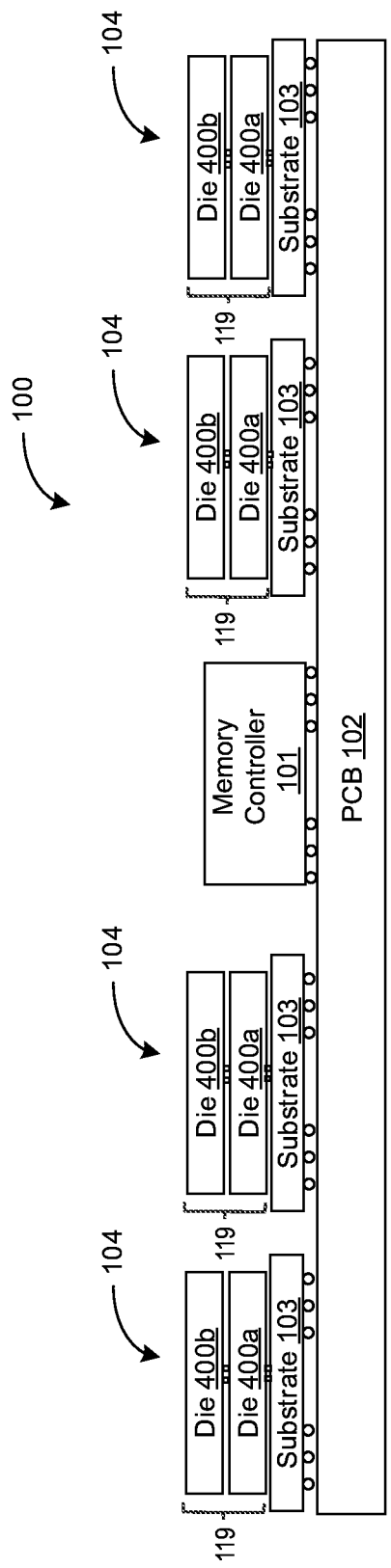
FIG. 1 is a block diagram schematically illustrating a memory system configured in accordance with various embodiments of the present technology.

A process corner of a memory device or memory die refers to a variation of fabrication parameters used in applying an integrated circuit design to a semiconductor wafer. Process corners represent the extremes of these parameter variations within which an integrated circuit must function correctly. An integrated circuit that includes memory devices or memory dies fabricated at these process corners may run slower or faster than specified and/or at lower or higher temperatures and/or voltages. If, however, the integrated circuit does not function at any of the process extremes, the memory device/die is considered to have inadequate design margin and is typically disposed of.

A memory device (e.g., a memory device having a three-dimensional stack (3DS) of memory dies) is sometimes built with memory dies having the same or nearly the same process corners. More often, however, there is often a lack of control during manufacture of a memory device over which specific memory dies are included in the memory device (e.g., in a 3DS), and ensuring that all memory dies in a memory device (e.g., in a 3DS) have similar process characteristics has proven technically difficult and cost prohibitive. Thus, memory devices are often built with memory dies having different process corners.

When memory dies having opposite process corners are stacked together in a 3DS, the 3DS may have poor and/or inadequate timing margins. Ring oscillator delta represents the difference between process characteristics of a master memory die and a slave memory die. At extreme ends of the delta distribution, slave memory die are more likely to fail (e.g., to have inadequate design margins). For example, when a slow master memory die is packaged with a fast slave memory die, the latch signal of the slave memory die may fire too early before the correct data is sent by the master memory die, leading to reception of the wrong data at the slave memory die and a failure at the slave memory die. Similarly, when a fast master memory die is packaged with a slow slave memory die, the latch signal of the slave memory die may fire too late after the data has already been sent by the master memory die, also leading to reception of the wrong data at the slave memory die and a failure at the slave memory die. Therefore, under either scenario, building a 3DS with memory dies having opposite process corners can lead to setup and hold data timing fails and/or other failures of the memory device.

In addition, due to circuit limitations, conventional master/slave memory devices are manufactured with a master memory die being the bottom memory die in a 3DS. Address and command signals received from external contacts of the conventional memory device are transmitted to the master memory die via a package substrate, and the master memory die (a) decodes the address and command signals and (b) transmits the decoded address and command signals to each of the slave memory dies in the 3DS. In other words, the master memory die in a conventional 3DS is the only memory die of the 3DS with full circuit connections to the package substrate of the conventional memory device. Thus, if an unrecoverable failure occurs on the master memory die, the entire conventional 3DS fails and is unrecoverable.

Accordingly, as discussed in greater detail below, the technology disclosed herein relates to memory systems and devices with post-packaging master die selection. In some embodiments, more than one memory die of a 3DS includes command/address decoders. In these embodiments, address and command signals received from external contacts of the memory device are transmitted to each memory die in the 3DS that includes command/address decoders (rather than to just the bottom memory die in the 3DS). Master selection circuitry selectively enables the command/address decoders of a memory die in the 3DS to designate that memory die as a master memory die of the 3DS. For example, if a memory device exhibits multiple fail modes for specific process corner shifts (e.g., (i) failure at high VDD for a fast master memory die and slow slave memory die combination and (ii) failure at low VDD for a slow master memory die and fast slave memory die combination), the master selection circuitry can select a master memory die that provides the most preferable design margins (e.g., the master selection circuitry can select the slow memory die over the fast memory die to serve as the master memory die). As a result, when a failure does occur, debug operations can focus on a fewer number of fail modes, thereby reducing debug time. Additionally or alternatively, selecting a master memory die with the most preferable design margins can increase memory device yield (e.g., the number of memory devices manufactured with adequate design margins), thereby reducing fabrication costs and waste.

A selected master memory die decodes the address and command signals received from external contacts of the memory device and transmits the decoded address and command signals to the other memory dies of the 3DS. In some embodiments, when an unrecoverable failure occurs on a memory die selected to serve as the master memory die, the master selection circuitry can (a) disable the command/address decoders of that memory die and/or (b) enable the command/address decoders of another memory die of the 3DS to designate the other memory die as the master memory die of the 3DS. Thus, in contrast with conventional memory devices, a 3DS configured in accordance with various embodiments of the present technology remains recoverable even in the event of an unrecoverable failure on a master memory die of the 3DS.

A person skilled in the art will understand that the technology may have additional embodiments and that the technology may be practiced without several of the details of the embodiments described below with reference to FIGS. 1-6. In the illustrated embodiments below, the memory devices and systems are primarily described in the context of memory dies arranged in a 3DS and communicatively coupled using TSVs. Memory devices and systems configured in accordance with other embodiments of the present technology, however, can include other three-dimensional stack arrangements (e.g., memory dies communicatively coupled using wire bonds, direct chip attachments, and/or other stacking technologies) and/or can include other arrangements of memory dies (e.g., non-3DS arrangements of memory dies).

Furthermore, in the illustrated embodiments below, the memory device and systems are primarily described in the context of devices incorporating devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

FIG. 1 is a block diagram schematically illustrating a memory system 100 configured in accordance with various embodiments of the present technology. The memory system 100 can include a memory controller 101 (e.g., a field programming gate array (FPGA) or other suitable memory controller) and one or more memory devices 104 (e.g., one or more dynamic random-access memory (DRAM) devices) electrically connected to the memory controller 101 via a printed circuit board (PCB) 102 (e.g., via one or more electrical contacts and/or traces). The memory controller 101 can be configured to control one or more operations of the memory system 100.

Individual memory devices 104 of the memory system 100 can include a package substrate 103 and one or more memory dies 400. As illustrated in FIG. 1, each of the memory devices 104 includes a two memory dies 400 (labeled individually as first memory die 400a and second memory die 400b). The first memory die 400a of each memory device 104 is attached to the package substrate 103, and the second memory die 400b is stacked on top of the first memory die 400a to form a three-dimensional stack (3DS) 119. In some embodiments, the first and second memory dies 400a and 400b are each electrically connected to the package substrate 103 (e.g., via one or more electrical contacts and/or traces), which in turn can be electrically connected to the PCB 102. For example, the first memory die 400a and/or the second memory die 400b can be electrically connected to the package substrate 103 via solder bumps or other electrical contacts (e.g., bond pads, wire bonds, die attach adhesives, through-silicon vias (TSVs), etc.) formed between the first memory die 400a and/or the second memory die 400b and the package substrate 103.

The memory system 100 can be connected to any one of a number of electronic devices that is capable of utilizing memory for the temporary or persistent storage of information, or a component thereof. For example, the memory system 100 can be operably connected to a host device (not shown). The host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to the memory system 100, although, in other embodiments, the host device may be indirectly connected to the memory system 100 (e.g., over a networked connection or through intermediary devices).

Figure 2:
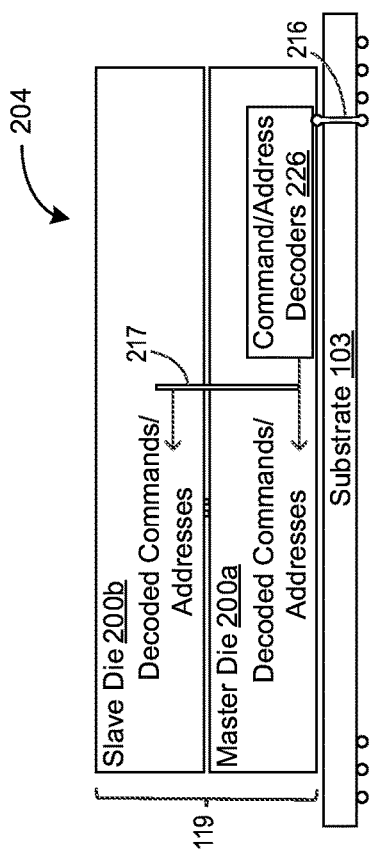
FIG. 2 is a block diagram schematically illustrating a conventional memory device.

FIG. 2 is a block diagram schematically illustrating a conventional memory device 204 having a master memory die 200a and a slave memory die 200b. The master memory die 200a of the conventional memory device 204 differs from the slave memory die 200b in that it includes command/address decoders 226. In addition, as shown in FIG. 2, because only the master memory die 200a includes command/address decoders 226, only the master memory die 200a is directly electrically connected to the package substrate 103 of the memory device 204 through solder balls and TSVs 216. Thus, address and command signals received from external contacts of the memory device are transmitted only to the master memory die 200a (i.e., to the command/address decoders 226 of only the master memory die 200a). In turn, the command/address decoders 226 of the master memory die 200a decode the address and command signals received from external contacts of the memory device, and transmit the decoded address and command signals to the slave memory die 200b via TSVs 217.

As discussed above, the arrangement of the conventional memory device 204 illustrated in FIG. 2 suffers from several drawbacks. For example, because address and command signals received from external contacts of the memory device are transmitted only to the master memory die 200a (i.e., the bottom memory die in the 3DS 119) of the memory device 204, the 3DS 119 is unrecoverable when an unrecoverable failure occurs on the master memory die 200a. For example, when an unrecoverable error occurs on the master memory die 200a, the slave memory die 200b has no way of receiving decoded command or address signals except through the defective master memory die 200a. Additionally, the conventional memory device 204 cannot resolve complications that arise when memory dies of opposite process corners are packaged in the same 3DS 119. For example, if the memory die 200a is faster than the memory die 200b, the memory device 204 may experience setup and hold data timing fails. In addition, debug operations in the event of failure would need to debug for the scenario where the memory die 200a is faster than the memory die 200b and for the scenario where the memory die 200a is slower than the memory die 200b, consuming a large amount of time, power, and/or processing resources. Furthermore, the memory die 200b cannot serve as the master memory die of the 3DS 119 and the memory die 200a cannot serve as a slave memory die of the 3DS even if this arrangement would lead to a reduction in the probability of failing (e.g., to less setup and hold data timing fails) and/or to a greater yield of memory devices with adequate timing margins.

Figure 3:
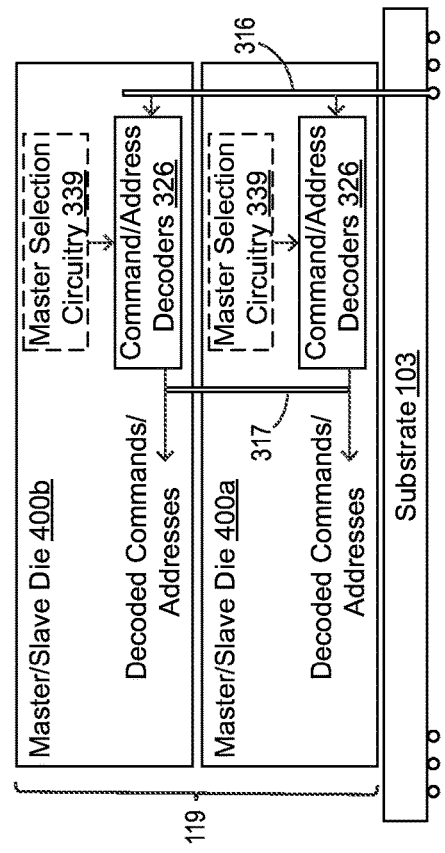
FIG. 3 is a block diagram schematically illustrating a memory device configured in accordance with various embodiments of the present technology.

FIG. 3 is a block diagram schematically illustrating a memory device 104 of FIG. 1. In contrast with the conventional memory device 204 illustrated in FIG. 2, the memory device 104 illustrated in FIG. 3 and configured in accordance with various embodiments of the present technology includes memory dies 400a and 400b that each include command/address decoders 326. As shown in FIG. 3, each of the memory dies 400a and 400b of the 3DS 119 are (e.g., directly) electrically connected to the package substrate 103 of the memory device 104 such that each of the memory dies 400a and 400b receive from the package substrate 103 address and command signals received from external contacts of the memory device 104. In some embodiments, the memory device 104 can include one or more additional TSVs 316 than a conventional memory device 204. The additional TSVs 316 can be used to electrically connect the memory dies 400a and/or 400b to the package substrate 103 (e.g., to transmit command/address signals received from external contacts of the memory device 104 and/or a memory die selection signal to the memory dies 400a and/or 400b). The number of additional TSVs 316 can be dependent on the number of memory dies 400 included in the 3DS 119. For example, the memory device 104 illustrated in FIG. 3 with two memory dies 400a and 400b can include five to ten additional TSVs than the conventional memory device 204 illustrated in FIG. 2.

Additionally, the memory die 400a and/or the memory die 400b can include master selection circuitry 339. In some embodiments, as described in greater detail below, the master selection circuitry 339 can be included in a fuse array (not shown) of the memory device 104 and/or of the memory die(s) 400a and/or 400b. In these and other embodiments, the master selection circuitry 339 can be standalone circuitry located on the memory die 400a and/or on the memory die 400b; spread across the memory dies 400a and 400b of the memory device 104; positioned within the package substrate 103; and/or positioned at other locations in a memory die, memory device, and/or memory system (e.g., on the system controller 101 (FIG. 1)). In operation, the master selection circuitry 339 is used to enable or disable command/address decoders 326 of the memory device 104 (e.g., of one or more respective memory dies 400a and/or 400b). Thus, the master selection circuitry 339 is used to select which of the memory dies 400a or 400b serves as the master memory die of the 3DS 119 and which serves as the slave memory die. In turn, the enabled command/address decoders 326 of the master memory die 400a or 400b decodes the address and command signals received over the TSVs 316, and transmits the decoded address and command signals to the slave memory die 400b or 400a over one or more TSVs 317 or other electrical connections.

In this manner, memory devices 104 configured in accordance with various embodiments of the present technology can select any one or more of the memory dies 400 of a 3DS 119 to serve as a master memory die of the 3DS 119. Thus, if a memory device exhibits multiple fail modes for specific process corner shifts, the master selection circuitry 339 of a memory device 104 can select the memory die 400 in the 3DS 119 that provides the most preferable design margins (e.g., the master selection circuitry 339 can select a slow memory die 400 over a fast memory die 400 (or vice versa) to serve as the master memory die of 3DS 119 to reduce the probability of failure and/or to limit the occurrence of setup and data hold timing fails. As a result, when a failure does occur post-packaging, debug operations can focus on a fewer number of fail modes, thereby reducing debug time and the amount of resources spent recovering the memory device 104. Additionally, or alternatively, selecting a master memory die with the most preferable design margins can increase memory device yield (e.g., the number of memory devices manufactured with adequate design margins), thereby reducing fabrication costs and waste. Furthermore, when an unrecoverable failure occurs on a memory die selected to serve as the master memory die post-packaging, the master selection circuitry 339 can (a) disable the command/address decoders 326 of that memory die and/or (b) enable the command/address decoders 326 of another memory die of the 3DS 119 to designate the other memory die as the master memory die of the 3DS 119. Thus, in contrast with conventional memory devices, a 3DS 119 configured in accordance with various embodiments of the present technology remains recoverable even in the event of an unrecoverable failure on a master memory die of the 3DS 119.

Although the devices 104 illustrated in FIGS. 1 and 3 are each illustrated with two memory dies 400a and 400b, one or more memory devices 104 configured in accordance with other embodiments of the present technology can include a greater or lesser number of memory dies 400 (e.g., one memory die or more than two memory dies) than illustrated. In these and other embodiments, the orientation of the memory dies 400 included in a memory device 104 can vary. For example, the first and second memory dies 400a and 400b illustrated in FIGS. 1 and 3 are each oriented face down (e.g., toward the package substrate 103) in a back-to-face orientation. In other embodiments, any one or more of the first and second memory dies 400a and/or 400b can be oriented face up (e.g., away from the package substrate 103) such the memory dies 400a and 400b are arranged in a face-to-back, face-to-face, and/or back-to-back orientation on a package substrate 103. In these and still other embodiments, the memory dies 400a and 400b can be arranged side-by-side on the package substrate 103, as opposed to the stacked arrangement illustrated in FIGS. 1 and 3.

Figure 4:
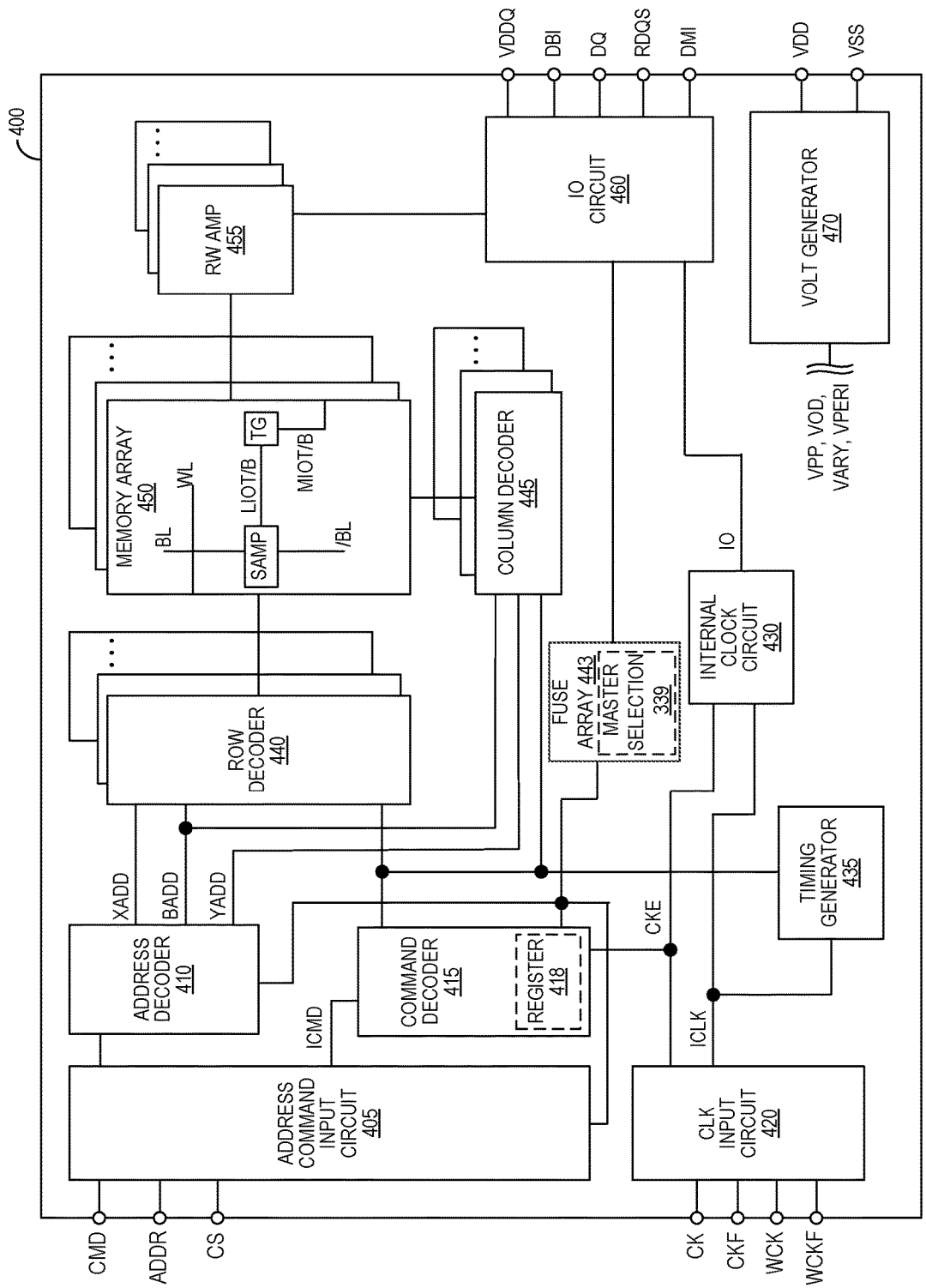
FIG. 4 is a block diagram schematically illustrating a memory die configured in accordance with various embodiments of the present technology.

FIG. 4 is a block diagram schematically illustrating a memory device 400 (e.g., a memory die 400, such as a first and/or second memory die 400a and/or 400b of FIGS. 1 and 3) configured in accordance with various embodiments of the present technology. The memory die 400 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, and power supply terminals VDD, VSS, and VDDQ.

The power supply terminals of the memory die 400 may be supplied with power supply potentials VDD and VSS. These power supply potentials VDD and VSS can be supplied to an internal voltage generator circuit 470. The internal voltage generator circuit 470 can generate various internal potentials VPP, VOD, VARY, VPERI, and the like based on the power supply potentials VDD and VSS. The internal potential VPP can be used in the row decoder 440, the internal potentials VOD and VARY can be used in sense amplifiers included in the memory array 450 of the memory die 400, and the internal potential VPERI can be used in many other circuit blocks.

The power supply terminals may also be supplied with power supply potential VDDQ. The power supply potential VDDQ can be supplied to the IO circuit 460 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 460 so that power supply noise generated by the IO circuit 460 does not propagate to the other circuit blocks.

The clock terminals and data clock terminals may be supplied with external clock signals and complementary external clock signals. The external clock signals CK, CKF, WCK, WCKF can be supplied to a clock input circuit 420. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 420 can receive the external clock signals. For example, when enabled by a CKE signal from a command decoder 415, an input buffer can receive the CK and CKF signals and the WCK and WCKF signals. The clock input circuit 420 can receive the external clock signals to generate internal clock signals ICLK. The internal clock signals ICLK can be supplied to an internal clock circuit 430. The internal clock circuit 430 can provide various phase and frequency controlled internal clock signals based on the received internal clock signals ICLK and a clock enable signal CKE from the command decoder 415. For example, the internal clock circuit 430 can include a clock path (not shown in FIG. 4) that receives the internal clock signal ICLK and provides various clock signals to the command decoder 415. The internal clock circuit 430 can further provide input/output (TO) clock signals. The IO clock signals can be supplied to an input/output (TO) circuit 460 and can be used as a timing signal for determining an output timing of read data and the input timing of write data. The IO clock signals can be provided at multiple clock frequencies so that data can be output from and input into the memory die 400 at different data rates. A higher clock frequency may be desirable when high memory speed is desired. A lower clock frequency may be desirable when lower power consumption is desired. The internal clock signals ICLK can also be supplied to a timing generator 435 and thus various internal clock signals can be generated that can be used by the command decoder 415, the column decoder 445, and/or other components of the memory die 400.

The memory die 400 may include an array of memory cells, such as memory array 450. The memory cells of the memory array 450 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells. In these and other embodiments, the memory regions of the memory array 450 can be arranged in one or more groups (e.g., groups of memory banks, one or more logical memory ranks or dies, etc.). Memory cells in the memory array 450 can include any one of a number of different memory media types, including capacitive, magnetoresistive, ferroelectric, phase change, or the like. The selection of a word line WL may be performed by a row decoder 440, and the selection of a bit line BL may be performed by a column decoder 445. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 450 may also include plate lines and corresponding circuitry for managing their operation.

As discussed above, the command terminals and address terminals may be supplied with an address signal and a bank address signal from outside the memory die 400. The address signal and the bank address signal supplied to the address terminals can be transferred, via a command/address input circuit 405, to an address decoder 410. The address decoder 410 can receive the address signals and supply a decoded row address signal (XADD) to the row decoder 440, and a decoded column address signal (YADD) to the column decoder 445. The address decoder 410 can also receive the bank address signal (BADD) and supply the bank address signal to both the row decoder 440 and the column decoder 445.

The command and address terminals can be supplied with command signals CMD, address signals ADDR, and chip selection signals CS (e.g., from the memory controller 101 and/or a host device). The command signals may represent various memory commands (e.g., including access commands, which can include read commands and write commands). The select signal CS may be used to select the memory device 104 and/or the memory die 400 to respond to commands and addresses provided to the command and address terminals. When an active CS signal is provided to the memory die 400, the commands and addresses can be decoded (e.g., using a command decoder 415) and memory operations can be performed. The command signals CMD may be provided as internal command signals ICMD to the command decoder 415 via the command/address input circuit 405. The command decoder 415 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 415. The command decoder 415 may further include one or more registers 418 for tracking various counts or values.

When a read command is issued, and a row address and a column address are timely supplied with the read command, read data can be read from memory cells in the memory array 450 designated by the row address and the column address. The read command may be received by the command decoder 415, which can provide internal commands to the IO circuit 460 so that read data can be output from the data terminals DQ, RDQS, DBI, and DMI via read/write (RW) amplifiers 455 and the IO circuit 460 according to the RDQS clock signals. The read data may be provided at a time defined by read latency information RL that can be programmed in the memory die 400 or 3DS 119 of memory dies 400, for example in a mode register (not shown in FIG. 4). The read latency information RL can be defined in terms of clock cycles of the CK clock signal. For example, the read latency information RL can be a number of clock cycles of the CK signal after the read command is received by the memory die 400 when the associated read data is provided.

When a write command is issued, and a row address and a column address are timely supplied with the command, write data can be supplied to the data terminals DQ, DBI, and DMI over DQ lines connected to the memory die 400 according to the WCK and WCKF clock signals. The write command may be received by the command decoder 415, which can provide internal commands to the IO circuit 460 so that the write data can be received by data receivers in the IO circuit 460, and supplied via the IO circuit 460 and the RW amplifiers 455 to the memory array 450 over IO lines of the memory die 400 or stack 119 of memory dies 400. The write data may be written in the memory cell designated by the row address and the column address. The write data may be provided to the data terminals at a time that is defined by write latency WL information. The write latency WL information can be programmed in the memory die 400, for example, in the mode register (not shown in FIG. 4). The write latency WL information can be defined in terms of clock cycles of the CK clock signal. For example, the write latency information WL can be a number of clock cycles of the CK signal after the write command is received by the memory die 400 when the associated write data is received.

The memory array 450 may be refreshed or maintained to prevent data loss, either due to charge leakage or imprint effects. A refresh operation, may be initiated by the memory die 400, by the memory system 100 (e.g., by the memory controller 101 of FIG. 1), and/or by a host device, and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory die 400 may be configured to refresh the same row of memory cells in every memory bank of the memory array 450 simultaneously. In another approach, the memory die 400 may be configured to refresh the same row of memory cells in every memory bank of the memory array 450 sequentially. In still another approach, the memory die 400 can further include circuitry (e.g., one or more registers, latches, embedded memories, counters, etc.) configured to track row (e.g., word line) addresses, each corresponding to one of the memory banks in the memory array 450. In this approach, the memory die 400 is not constrained to refresh the same row in each memory bank of the memory array 450 before refreshing another row in one of the memory banks.

Regardless of the refresh approach, the memory die 400 can be configured to refresh memory cells in the memory array 450 within a given refresh rate or time window (e.g., 32 ms, 28 ms, 25 ms, 23 ms, 21 ms, 18 ms, 16 ms, 8 ms, etc.), known as tREF. In these embodiments, the memory device 104 and/or the memory system 100 can be configured to supply refresh commands to the memory die 400 in accordance with a specified minimum cadence tREFI. For example, the memory device 104 and/or the memory system 100 can be configured to supply one or more refresh commands to the memory die 400 at least every 7.8 μs such that an approximate minimum of 4000 refresh commands are supplied to the memory die 400 within a 32 ms time window.

The memory device 400 further includes master selection circuitry 339. As illustrated in FIG. 4, the master selection circuitry 339 is included in a fuse array 443 of the memory device 104 and/or of the memory die 400. The fuse array 443 and/or the master selection circuitry 339 can include antifuse elements. An antifuse element is an element which is insulated in an initial state and, when subjected to a dielectric breakdown by a connect operation, makes a transition to a conductive state. When the transition to the conductive state is made by the connect operation, the antifuse element cannot be returned to the insulated state. Therefore, the antifuse element can be used as a nonvolatile and irreversible storage element, and may be programmed using conventional antifuse programming circuits. Additionally, or alternatively, the master selection circuitry 227 can be one or more circuits independent of the fuse array 443 and/or positioned at other locations on the memory die 400, on the memory device 104, and on the memory system 100 (e.g., on the memory controller 101).

As shown in FIG. 4, the master selection circuitry 339 is in electrical communication with the command/address input circuit 405, the address decoder 410, and/or the command decoder 415 of the memory die 400. In some embodiments, the memory die 400 can be designated as a master memory die and/or as a slave memory die using the master selection circuitry 339 of the fuse array 443. For example, antifuse elements of the master selection circuitry 339 in the fuse array 443 can be transitioned to their insulated states to activate (enable) and/or deactivate (disable) the command/address input circuit 405, the address decoder 410, and/or the command decoder 415 of the memory die 400. When activated, the command/address input circuit 405, the address decoder 410, and/or the command decoder 415 can be used to decode address and command signals received from external contacts of the memory device that are transmitted to the memory die 400.

In turn, the memory die 400 can serve as a master memory die and transmit the decoded address and/or command signals to appropriate circuits of the memory die 400 and/or to appropriate circuits of other memory die (e.g., other activated memory die) in a 3DS 119 that includes the memory die 400. When deactivated, the command/address input circuit 405, the address decoder 410, and/or the command decoder 415 are not used to decode address and command signals received from external contacts of the memory device that are transmitted to the memory die 400. Instead, the memory die 400 serves as a slave memory die and waits to receive decoded address and/or command signals from another, master memory die in a 3DS 119 that includes the memory die 400. In this manner, the master selection circuitry 339 can selectively enable the address/command decoders of a memory die 400 to selectively enable the memory die 400 as a master memory die regardless of the position of the memory die 400 in a 3DS 119.

Figure 5:
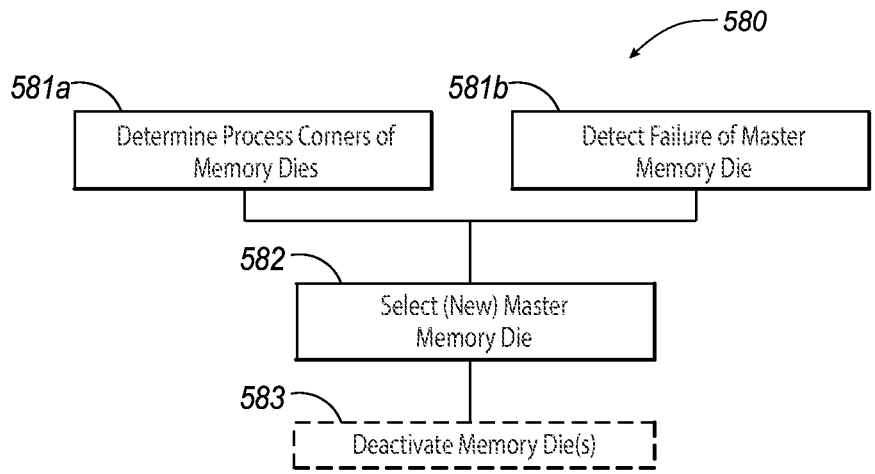
FIG. 5 is a flow diagram illustrating a master die selection routine of a memory device configured in accordance with various embodiments of the present technology.

FIG. 5 is a flow diagram illustrating a master selection routine 580 in accordance with various embodiments of the present technology. In some embodiments, the routine 580 can be executed, at least in part, by the memory device, a memory controller operably connected to the memory device, and/or a host device operably connected to the memory controller and/or to the memory device. For example, all or a subset of the steps of the routine 580 can be carried out by master selection circuitry and/or antifuse elements of a fuse array. In these and other embodiments, all or a subset of the steps of the routine 580 can be performed by other components of the memory device (e.g., a command decoder, an address decoder, a command/address input circuit, etc.), by components of the memory controller, by components of the host device, and/or by other components of a memory system containing the memory device.

The routine 580 can begin at block 581 by determining the process corners of memory dies included in a 3DS. In some embodiments, the routine 580 can determine the process corners by determining process characteristics of one of more of the memory dies in the 3DS. For example, the routine 580 can determine the drive strength(s) of the one or more memory dies in the 3DS. In these and other embodiments, the routine 580 can determine a ring oscillator delta distribution between various memory dies in the 3DS. In these and still other embodiments, the routine 580 can use the determined process corners, process characteristics, ring oscillator delta distribution, and/or other characteristics to identify whether fail modes exist at process corner shifts.

At block 582, the routine 580 can select one or more memory dies in the 3DS to serve as a master memory die. In some embodiments, the routine 580 can select a memory die to serve as a master memory die of the 3DS by enabling command/address decoders of the memory die. In these and other embodiments, the routine 580 can select a memory die to serve as a master memory die of the 3DS by disabling command/address decoders of other memory dies in the 3DS. In some embodiments, the routine 580 can enable and/or disable command/address decoders of memory dies of the 3DS using master selection circuitry. For example, the routine 580 can enable or disable command/address decoders of memory dies using antifuse elements of one or more fuse arrays corresponding to the memory dies. In these and other embodiments, the routine 580 can enable or disable command/address decoders of memory dies using stand-alone circuitry.

Additionally, or alternatively, the routine 580 uses the determined process corners, process characteristics, ring oscillator delta distribution, fail modes, and/or other characteristics to select the master memory die. As an example, the routine 580 can determine that a first memory die is fast relative to other memory dies in a 3DS and that a second memory die is slow relative to other memory dies in the 3DS. In this example, the routine 580 can determine that selecting the fast memory die to serve as the master memory die creates a fail mode at a high VDD process corner shift, whereas selecting the slow memory die to serve as the master memory die creates a fail mode at a low VDD process corner shift. Continuing with this example, the routine 580 can determine that selecting the slow memory die to serve as the master memory die of the 3DS leads to a greater yield of memory devices having adequate design margins than selecting the fast memory die to serve as the master memory die. Thus, the routine 580 can select the slow memory die to serve as the master memory die of the 3DS, thereby increasing manufacturing yield and allowing the routine 580 to focus debug operations on only the low VDD fail mode should a failure be detected in the future.

Alternatively, the routine 580 can begin at block 581b by detecting a failure on a memory die selected as a master memory die of the 3DS. For example, the routine 580 can detect a failure on a master memory die post-packaging. In some embodiments, the routine 580 can perform debug operations on the master memory die to attempt to recover from the failure. If the routine 580 successfully recovers the master memory die from the failure using the debug operations, the routine 580 can terminate. Otherwise, the routine 580 can proceed to block 582 to select a new master memory die. In some embodiments, the routine 580 can select a new master memory die by disabling the command/address decoders of the failed memory die. In these and other embodiments, the routine 580 can select a new master memory die by enabling the command/address decoders of another memory die of the 3DS. In these embodiments, the routine 580 can attempt to recover the 3DS using the new master memory die. In these and still other embodiments, to select a new master memory die, the routine 580 can (a) determine the process corners of one or more memory dies of the 3DS in accordance with the discussion above (block 581a) and/or (b) use the determined process corners, process characteristics, and/or ring oscillator delta distribution to identify a new master memory die. In some embodiments, the routine 580 can proceed to block 583.

At block 583, the routine 580 disables one or more memory dies of the 3DS. For example, the routine 580 can deactivate a memory die that served as a master memory die of the 3DS but upon which an unrecoverable failure occurred or that is otherwise exhibiting signs of reliability failure. In the context of a 3DS, the routine 580 in these and other embodiments can deactivate one or more memory dies that are positioned higher in the 3DS than the memory die upon which an unrecoverable failure occurred or that is otherwise exhibiting signs of reliability failure. In this manner, the routine 480 can recover unaffected portions of a memory device in the event of an unrecoverable error or signs of reliability failure on a master memory die of the memory device and/or 3DS. As such, an unrecoverable failure or signs of reliability failure on a master memory die of the memory device and/or 3DS is rarely fatal to the entire memory device and/or 3DS.

Although the steps of the routine 580 are discussed and illustrated in a particular order, the method illustrated by the routine 580 in FIG. 5 is not so limited. In other embodiments, the method can be performed in a different order. In these and other embodiments, any of the steps of the routine 580 can be performed before, during, and/or after any of the other steps of the routine 580. Moreover, a person of ordinary skill in the relevant art will readily recognize that the illustrated method can be altered and still remain within these and other embodiments of the present technology. For example, one or more steps of the routine 580 illustrated in FIG. 5 can be omitted and/or repeated in some embodiments.

Figure 6:
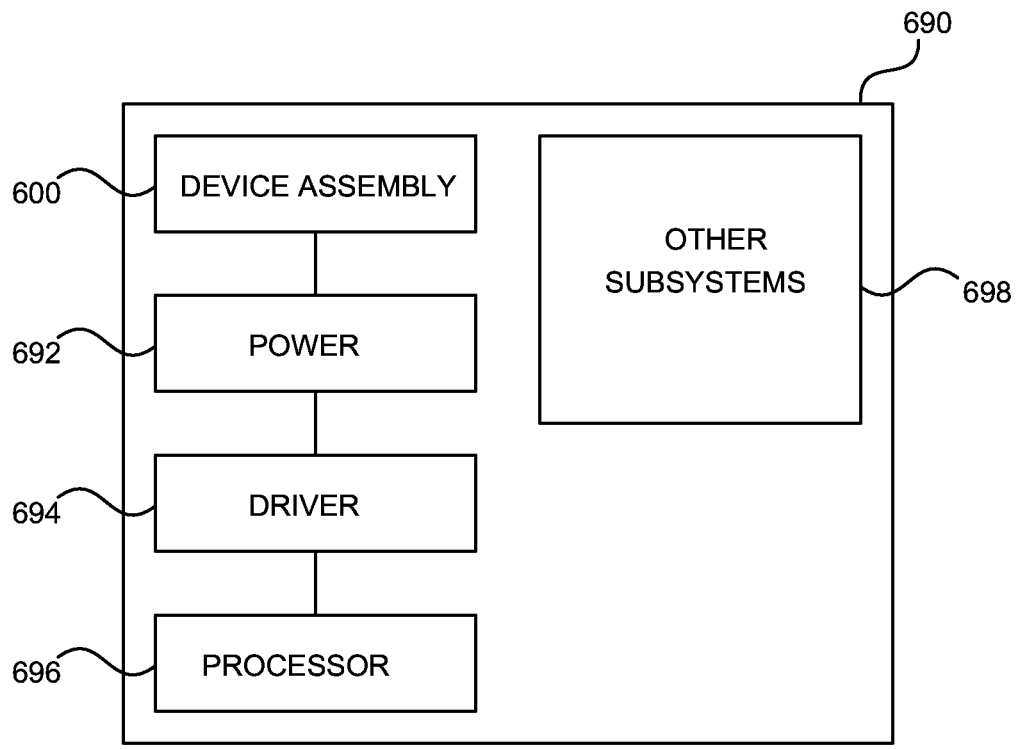
FIG. 6 is a schematic view of a system that includes a memory device configured in accordance with various embodiments of the present technology.

FIG. 6 is a schematic view of a system that includes a memory device in accordance with embodiments of the present technology. Any one of the foregoing memory devices described above with reference to FIGS. 1-5 can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory device described above with reference to FIGS. 1-5, and can, therefore, include various features of memory content authentication. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory device, comprising:
   a plurality of memory dies, each memory die of the plurality of memory dies including:
   command/address decoders coupled to external contacts of the memory device and configured to (a) receive command and address signals from the external contacts and (b) when enabled, to decode the command and address signals and to transmit the decoded command and address signals to other memory dies of the plurality of memory dies; and
   master selection circuitry configured to enable, or disable, or both corresponding command/address decoders of a respective memory die,
   wherein the command/address decoders of the plurality of memory dies are each enabled or disabled via the corresponding master selection circuitry based at least in part on differences between one or more process corners of memory dies of the plurality of memory dies.

2. The memory device of claim 1, further comprising at least one through-silicon via (TSV) configured to transmit command and address signals from the external contacts to inputs of the command/address decoders of each memory die of the plurality of memory dies.

3. The memory device of claim 2, wherein the plurality of memory dies comprise every memory die of the memory device.

4. The memory device of claim 1, wherein each of the plurality of memory dies further includes a fuse array, wherein each fuse array includes at least a portion of the master selection circuitry of a corresponding memory die, and wherein the master selection circuitry of each memory die is configured to enable, or disable, or both the corresponding command/address decoders based at least in part on a fuse or antifuse setting in the fuse array.

5. The memory device of claim 1, wherein the command/address decoders of only one memory die of the plurality of memory dies is enabled.

6. The memory device of claim 5, wherein the only one memory die corresponding to the enabled command/address decoders is a master memory die.

7. The memory device of claim 6, wherein the plurality of memory dies is arranged in a three-dimensional stack (3DS), and wherein the master memory die is not a bottommost memory die of the 3DS.

8. The memory device of claim 6, wherein at least one memory die corresponding to disabled command/address decoders is a slave memory die and is configured to receive decoded command and address signals from the master memory die.

9. The memory device of claim 8, wherein the plurality of memory dies is arranged in a three-dimensional stack (3DS), and wherein the slave memory die is a bottommost die of the 3DS.

10. The memory device of claim 1, wherein the memory device is a dynamic random access memory (DRAM) device.

11. The memory device of claim 1, wherein the one or more process corners include or relate to drive strengths of the memory dies of the plurality of memory dies, characteristics corresponding to a ring oscillator delta distribution related to the memory dies, timing margins of the memory dies, run speeds of the memory dies, or any combination thereof.

12. A method, comprising: detecting one or more differences between one or more characteristics of memory dies of a memory device, wherein the one or more characteristics include drive strengths of the memory dies, first characteristics corresponding to a ring oscillator delta distribution related to the memory dies, second characteristics corresponding to process corners of the memory dies, run speeds of the memory dies, or a combination thereof; and selecting a memory die from among the memory dies as a master memory die based at least in part on the detected differences between the one or more characteristics, wherein selecting the memory die includes enabling command/address decoders of the memory die to decode command and address signals transmitted to the memory die.

13. The method of claim 12, further comprising transmitting decoded command and address signals to other memory dies of the memory device using the enabled command/address decoders of the selected memory die.

14. The method of claim 12, wherein the selecting further includes disabling the command/address decoders of another memory die of the memory device.

15. The method of claim 12, wherein the selecting includes selecting the memory die as the master memory die after the memory dies are packaged in the memory device.

16. The method of claim 12, further comprising:
detecting a failure on the master memory die; and
performing debug operations on a fail mode of the memory device to recover from the detected failure.

17. The method of claim 12, further comprising:
detecting a failure on the selected memory die; and
disabling the enabled command/address decoders of the selected memory die in response to detecting the failure.

18. The method of claim 12, further comprising:
detecting a failure on the selected memory die; and
enabling the command/address decoders of another memory die of the memory device in response to detecting the failure.

19. The method of claim 18, further comprising deactivating the selected memory die or disabling the command/address decoders of the selected memory die.

20. A memory system, comprising:
a memory controller; and
a memory device operably connected to the memory controller,
wherein the memory device includes a plurality of memory dies,
wherein each memory die of the plurality of memory dies includes command/address decoders and master selection circuitry,
wherein the command/address decoders of each memory die are configured to receive command and address signals from external contacts of the memory device at inputs of the command/address decoders,
wherein the command/address decoders of each memory die are further configured, when enabled, to decode the command and address signals and transmit the decoded command and address signals to every other one of the plurality of memory dies,
wherein the master selection circuitry of each memory die is configured to enable, or disable, or both respective command/address decoders of the plurality of memory dies after the plurality of memory dies are packaged in the memory device based at least in part on an input from a host device or the memory controller or both to the memory device, a fuse or antifuse setting of one or more memory dies of the plurality of memory dies, or a setting of one or more registers of the memory device, or any combination thereof,
wherein the input from the host device or the memory controller or both, the fuse or antifuse setting of the one or more memory dies, the setting of the one or more registers, or the any combination thereof is based at least in part on difference detected between one or more characteristics of at least two memory dies of the plurality of memory dies, wherein the one or more characteristics include drive strengths of the at least two memory dies, first characteristics corresponding to a ring oscillator delta distribution related to the at least two memory dies, second characteristics corresponding to process corners of the memory dies, run speeds of the memory dies, or a combination thereof, and
wherein the command/address decoders of only one memory die of the plurality of memory dies are enabled.

21. The memory system of claim 20, wherein the only one memory die corresponding to the enabled command/address decoders is a master memory die, wherein the plurality of memory dies are arranged in a three-dimensional stack (3DS), and wherein the master memory die is not a bottommost memory die of the 3DS.

* * * * *